United States Patent [19]

Ogura et al.

[11] Patent Number: 5,165,062
[45] Date of Patent: Nov. 17, 1992

[54] AUTOMATIC PRINTING SYSTEM

[75] Inventors: Toshiyuki Ogura; Takashi Hasegawa; Norihiro Nakai, all of Minamiashigara; Seiki Karikomi, Tokyo, all of Japan

[73] Assignee: Fuji Photo Film Co., Ltd., Kanagawa, Japan

[21] Appl. No.: 611,618

[22] Filed: Nov. 5, 1990

[30] Foreign Application Priority Data

Nov. 13, 1989 [JP] Japan .................................. 1-295824

[51] Int. Cl.$^5$ ........................ G03B 27/32; G03B 27/52
[52] U.S. Cl. ......................................... 355/27; 355/85; 355/86; 355/87; 355/89; 355/97; 355/99; 355/100
[58] Field of Search ........................ 355/27, 85, 86, 87, 355/89, 97, 99, 100

[56] References Cited

U.S. PATENT DOCUMENTS 4,583,838 4/1986 Machida et al. ..................... 355/85

FOREIGN PATENT DOCUMENTS

| | | |
|---|---|---|
| 3206025A1 | 9/1983 | Fed. Rep. of Germany . |
| 3207903A1 | 11/1983 | Fed. Rep. of Germany . |
| 8229160 | 6/1984 | Fed. Rep. of Germany . |
| 3424117A1 | 1/1985 | Fed. Rep. of Germany . |
| 3790460C2 | 4/1990 | Fed. Rep. of Germany . |
| 57-201224 | 12/1982 | Japan . |
| 0866016 | 4/1961 | United Kingdom . |
| 1064213 | 4/1967 | United Kingdom . |
| 1583436 | 1/1981 | United Kingdom . |
| 2142442 | 6/1985 | United Kingdom . |
| 2154011 | 8/1985 | United Kingdom . |

Primary Examiner—Monroe H. Hayes
Attorney, Agent, or Firm—Sughrue, Mion, Zinn, Macpeak & Seas

[57] ABSTRACT

An automatic printing system includes an array of printing devices arranged along a direction in which the printing member is fed, each of printing devices having a positioning mechanism for positioning the printing member, a feeding device for feeding a printing member to each printing device, a delivery device for picking up the printing member from the feeding device and bringing the printing member into engagement with the positioning mechanism, and a discharging device for discharging the printing member, which has been exposed by the printing device, from the printing device. the automatic printing system further includes a supplying device for storing printing members of different sizes and selectively supplying the printing members one at a time, a punching device for forming a positioning opening in the printing member supplied by the supplying device, and an automatic developing device for developing the printing member which has been exposed by the printing device.

6 Claims, 7 Drawing Sheets

AUTOMATIC PRINTING SYSTEM

BACKGROUND OF THE

1. Field of the Invention

The present invention relates to an automatic printing system for automatically printing an image of an original on a printing member, which may comprise a support base coated with a photosensitive material.

2. Prior Art

Generally, printing systems for use in the photomechanical process require a manual procedure to be carried out for a considerable number of operations such, for example, as highly accurate positioning of an original and a printing member, which may comprise a support base coated with a photosensitive material. There have been proposed various systems to make more efficient and automatize the photomechanical process (see Japanese Laid-Open Patent Publication No. 57(1982)-201224, for example).

In the conventional printing system, however, the printing member still has to be manually mounted in a positioning mechanism by the operator. Therefore, it has failed to automatize the entire printing operation in the conventional printing system.

SUMMARY OF THE INVENTION

It is an object of the present invention to provide an automatic printing system which includes a means for automatically mounting a printing member in, and removing the printing member from, a printing device, so that the entire printing operation can easily be made more efficient and automatized.

According to the present invention, there is provided an automatic printing system comprising at least one printing device for exposing a printing member, the printing device having a positioning mechanism for positioning the printing member, a feeding device for feeding a printing member to the printing device, a delivery device for picking up the printing member from the feeding device and bringing the printing member into engagement with the positioning mechanism, and a discharging device for discharging the printing member, which has been exposed by the printing device, from the printing device.

The automatic printing system comprises an array of printing devices arranged along a direction in which the printing member is fed, the feeding device comprising a belt conveyor for feeding the printing member, and a plurality of lifting and lowering mechanisms associated respectively with the printing devices, for lifting a printing member to be delivered to one of the printing devices while allowing another printing member to pass through the other printing devices.

The delivery device comprises a swing arm, a plate movably mounted on the swing arm, a positioning mechanism mounted on the plate, for engaging in a hole defined in the printing member, and a suction mechanism mounted on the plate, for holding the printing member under suction.

The automatic printing system also includes a supplying device for storing printing members of different sizes and selectively supplying the printing members one at a time, the supplying device being disposed upstream of the printing device along a direction in which the printing member is fed, and a punching device for forming a positioning opening in the printing member supplied by the supplying device.

The automatic printing system further includes an automatic developing device for developing the printing member which has been exposed by the printing device, the automatic developing device being disposed downstream of the printing device along a direction in which the printing member is fed.

The above and other objects, features and advantages of the present invention will become more apparent from the following description when taken in conjunction with the accompanying drawings in which a preferred embodiment of the present invention is shown by way of illustrative example.

DETAILED DESCRIPTION OF THE PREFERRED EMBODIMENT

Figure 2:
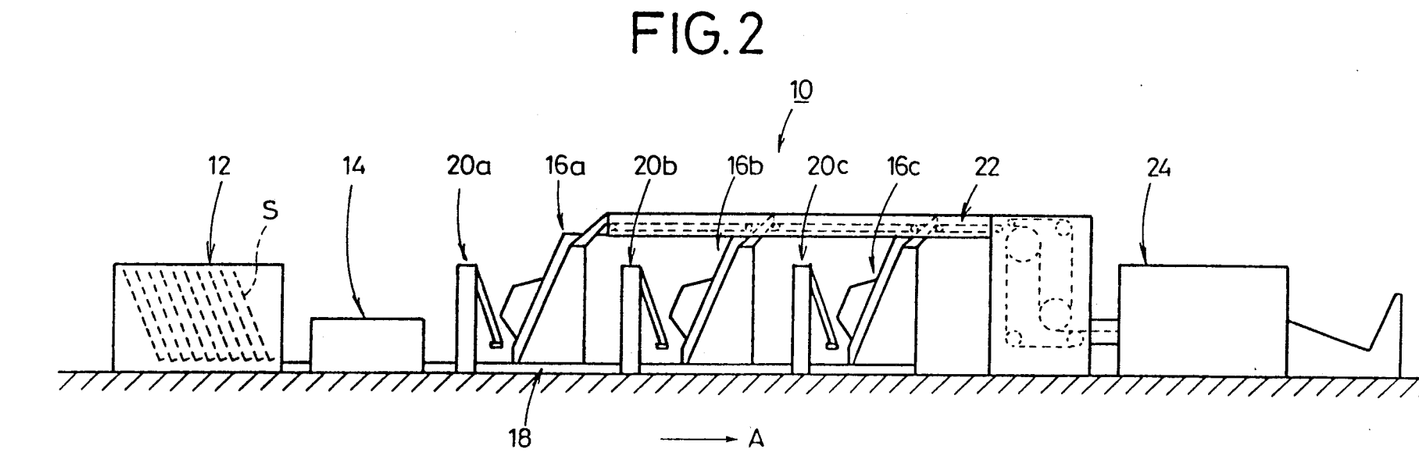
FIG. 2 is a side elevational view of a printing line incorporating the automatic printing system shown in FIG. 1.

FIG. 2 shows an automatic printing system, generally designated by the reference numeral 10, according to the present invention. The automatic printing system 10 comprises a supplying device 12 disposed in an upstream position with respect to a feeding direction indicated by the arrow A, for storing a predetermined number of printing members S of different sizes and selectively delivering out printing members S, a punching device 14 for forming positioning holes or openings in printing members S which have been fed from the supplying device 12, a plurality of printing devices 16a through 16c which are spaced at certain intervals, a feeding device 18 for selectively feeding printing members S to the printing devices 16a through 16c, a plurality of delivery devices 20a through 20c for bringing printing members S on the feeding device 18 into engagement with printing mechanisms (described later on) which are associated respectively with the printing devices 16a through 16c, a discharging device 22 for discharging printing members S after they have been exposed to desired images, and an automatic developing device 24 for developing printing members S after the exposure.

Figure 3:
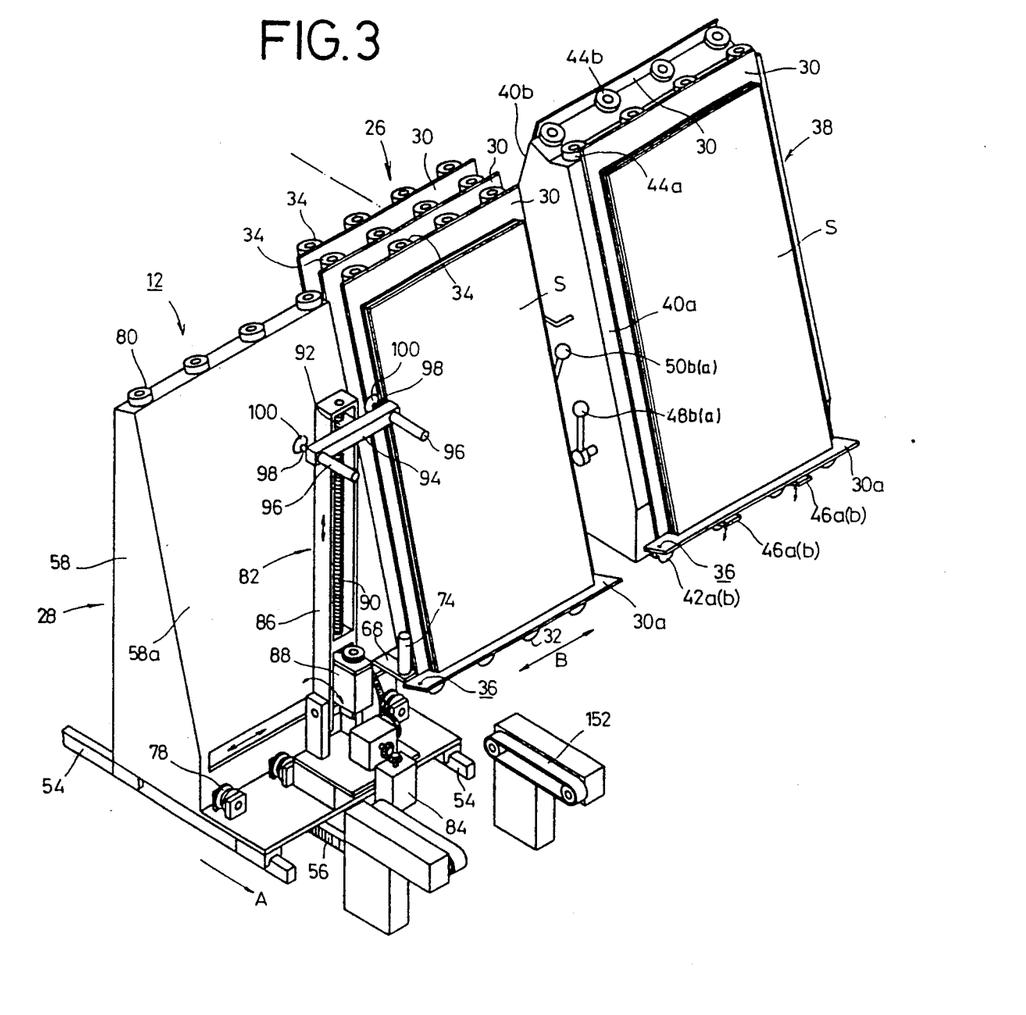
FIG. 3 is a perspective view of a supplying device of the automatic printing system.

As shown in FIG. 3, the supplying device 12 includes a stocker 26 and a removal mechanism 28. The stocker 26 has an array of trays 30 for storing predetermined numbers of printing members S of different sizes, respectively. The trays 30 have bent lower ends 30a disposed on guide rollers 32 and upper ends supported on guide rollers 34, the trays 30 being inclined with respect to the vertical direction. The trays 30 are successively arranged in the direction indicated by the arrow A.

Each of the trays 30 is in the form of a thin panel, with a hole 36 defined in the lower end 30a.

The trays 30 can be loaded into and unloaded from the stocker 26 by a carriage 38. The carriage 38 has a pair of inclined opposite side surfaces 40a, 40b, and lower guide rollers 42a, 42b and upper guide rollers 44a, 44b which are mounted on lower and upper ends, respectively, of the side surfaces 40a, 40b. Pairs of support arms 46a, 46b are also mounted on the lower end of the carriage 38 near the lower guide rollers 42a, 42b, respectively. The support arms 46a, 46b can be vertically angularly displaced when levers 48a, 48b mounted on opposite ends of the carriage 38 are turned. Lock levers 50a, 50b are also mounted on the opposite ends of the carriage 38, for locking and unlocking casters (not shown) mounted on the bottom of the carriage 38 to stop and move the carriage 38.

Figure 4:
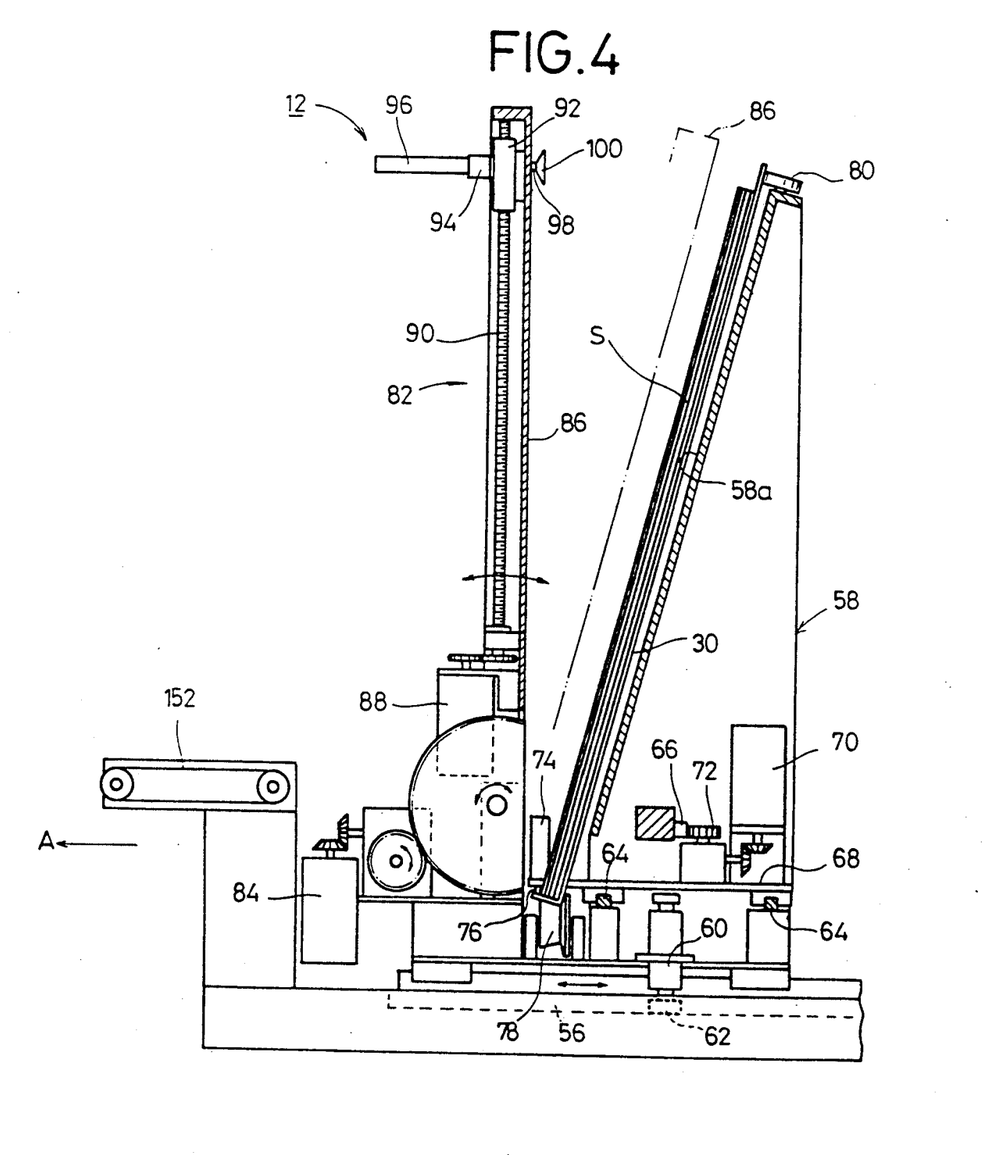
FIG. 4 is a vertical cross-sectional view of the supplying device.

The removal mechanism 28 has a pair of parallel spaced rails 54 extending in the direction indicated by the arrow A, and a rack 56 disposed between and extending along the rails 54. A feed unit 58 is disposed on the rails 54. As shown in FIG. 4, the feed unit 58 has a rotative drive source or actuator 60 which rotates a pinion 62 held in mesh with the rack 56.

Figure 5:
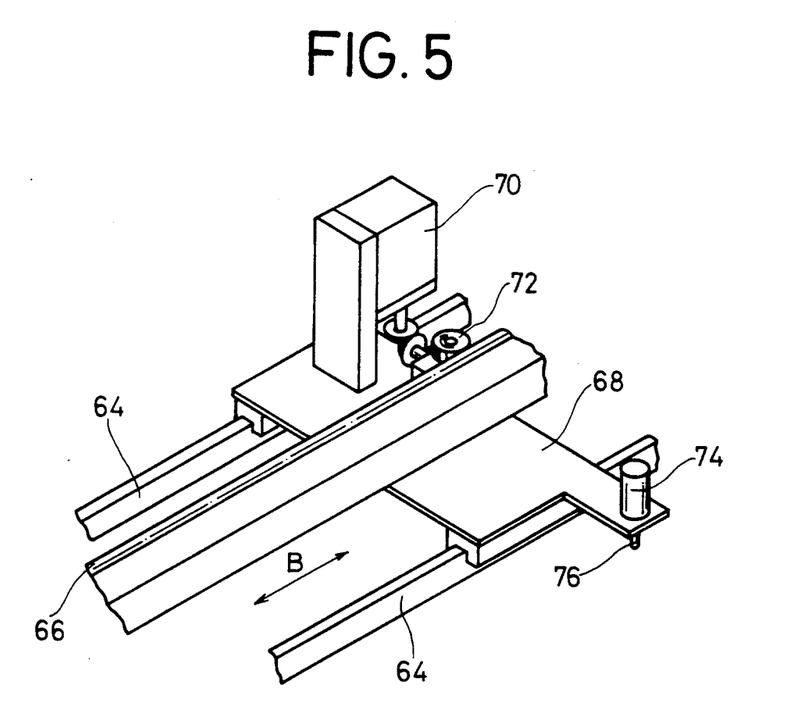
FIG. 5 is a fragmentary perspective view of a mobile base of the supplying device.

In FIG. 4, the feed unit 58 also has pair of parallel spaced rails 64 mounted on a mobile base 68 and extending in the direction indicated by the arrow B normal the direction A, and a rack 66 extending in the direction B. A rotative drive source or actuator 70 is fixedly mounted on the mobile base 68 and is operatively connected to a pinion 72 which is held in mesh with the rack 66. The mobile base 68 supports a cylinder 74 fixed thereto and has a downwardly extending piston rod to which there is connected a rod 76 for fitting in the hole 36 of each of the trays 30 (see FIGS. 3 and 5).

The feed unit 58 has guide rollers 78, 80 on its lower and upper ends, the guide rollers 78, 80 being positioned in line with the guide rollers 32, 34 of the stocker 26. The feed unit 58 includes a support surface 58a that is inclined at the same angle as the angle at which the trays 30 are inclined. The supplying device 12 includes a printing member pickup mechanism 82 disposed for swinging movement toward and away from the support surface 58a.

As shown in FIGS. 3 and 4, the printing member pickup mechanism 82 has a frame 86 which is swingably movable by a rotative drive source or actuator 84. The frame 86 supports a ball screw 90 extending therealong and operatively coupled to a rotative drive source or actuator 88 which is mounted on a lower end of the frame 86. Over the ball screw 88, there is threaded a slide base 92 to which a pair of spaced cylinders 96 are attached through an attachment bar 94. The cylinders 96 have respective piston rods 98 on which there are mounted suction pads or cups 100 that are connected to a vacuum source or generator (not shown).

Figure 6:
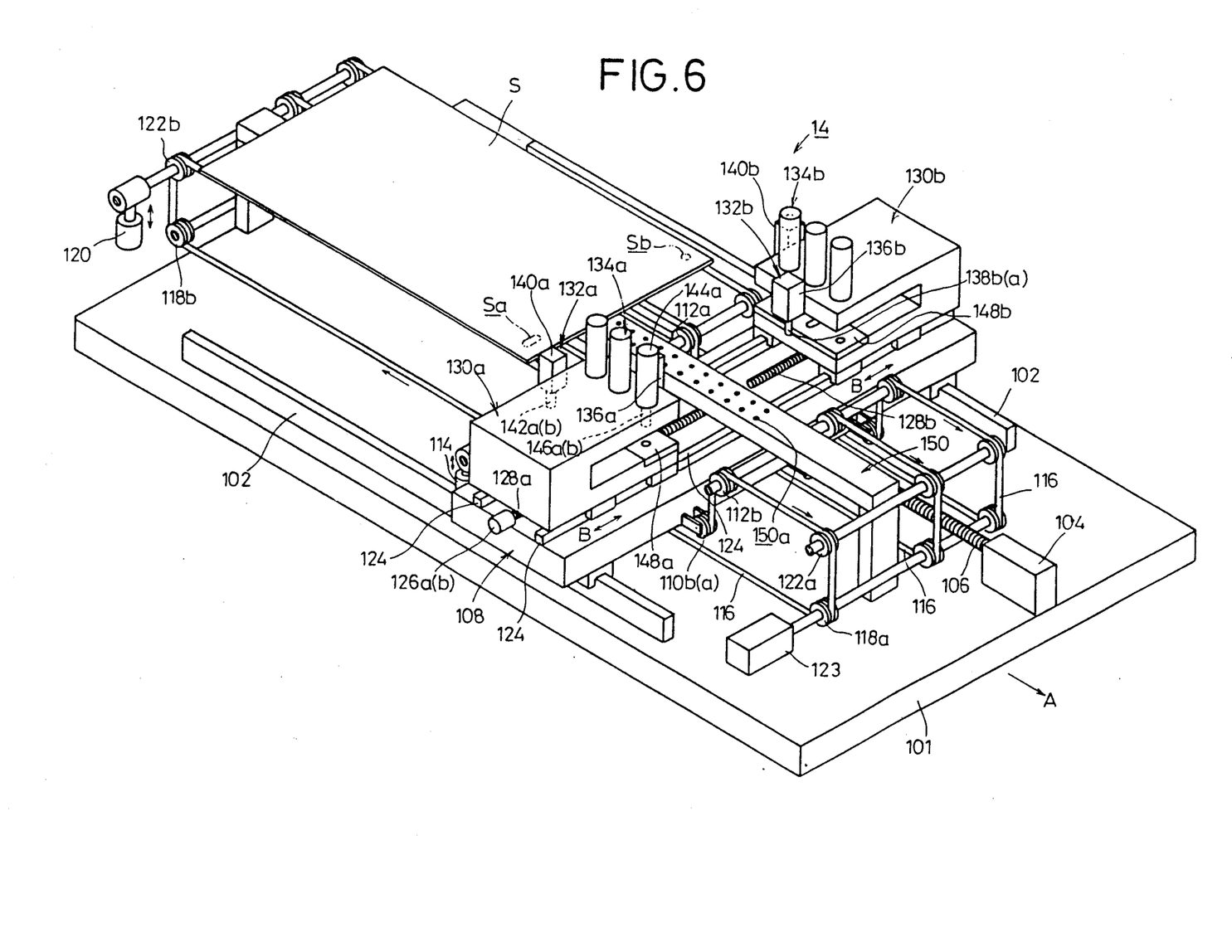
FIG. 6 is a perspective view of a punching device of the automatic printing system.

As shown in FIG. 6, the punching device 14 has a mount base 101 on which there is mounted a pair of guide rails 102 extending in the direction A. A movable base 108 is mounted on the guide rails 102 for back-and-forth movement in the direction A, the movable base 108 being held in threaded engagement with a ball screw 106 connected to a rotative drive source or actuator 104 mounted on the mount base 101. The movable base 108 supports thereon three pairs of lower guide rollers 110a, 110b and upper guide rollers 112a, 112b. The upper guide rollers 112a are vertically movable by a cylinder 114. Endless belts 116 of circular cross section are trained around the lower guide rollers 110a, 110b and the upper guide rollers 112a, 112b. The endless belts 116 are also trained around lower guide rollers 118a, 118b and upper guide rollers 122a, 122b which are supported on the mount base 101, the lower guide rollers 118a being rotatable by a rotative drive source or actuator 123 that is mounted on the mount base 101. The upper guide rollers 122b are vertically movable by a cylinder 120.

A pair of parallel spaced guide rails 124 is fixedly mounted on the movable base 108, the guide rails 124 extending in the direction B. A pair of other movable bases 130a, 130b is mounted on the guide rails 124, the movable bases 130a, 130b being held in threaded engagement with ball screws 128a, 128b, respectively, which are coupled to respective rotative drive source or actuators 126a, 126b.

The movable bases 130a, 130b support thereon respective positioning mechanisms 132a, 132b engageable with a leading end and opposite sides of a printing member S which is fed in the direction A, and respective punching mechanisms 134a, 134b for forming holes or openings in the printing member S.

The positioning mechanism 132a comprises an engaging pin 138a which is vertically movable by a cylinder 136a, and an engaging pin 142a which is vertically movable by a cylinder 140a. The punching mechanism 134a comprises a plurality of punches 146a which are vertically movable by respective cylinders 144a, and a die 148a having circular or oblong holes or openings defined therein which are complementary in shape to the cross-sectional shape of the punches 146a. The positioning mechanism 132b and the punching mechanism 134b are identical in structure to the positioning mechanism 132a and the punching mechanism 134a, respectively. Those parts of the positioning mechanism 132b and the punching mechanism 134b which are identical to those of the positioning mechanism 132a and the punching mechanism 134a are denoted by identical reference numerals with a suffix b.

A holder mechanism 150, which extends in the direction A, is disposed between the movable bases 130a, 130b. The holder mechanism 150 has a plurality of suction holes 150a connected to a vacuum source or generator (not shown).

Figure 1:
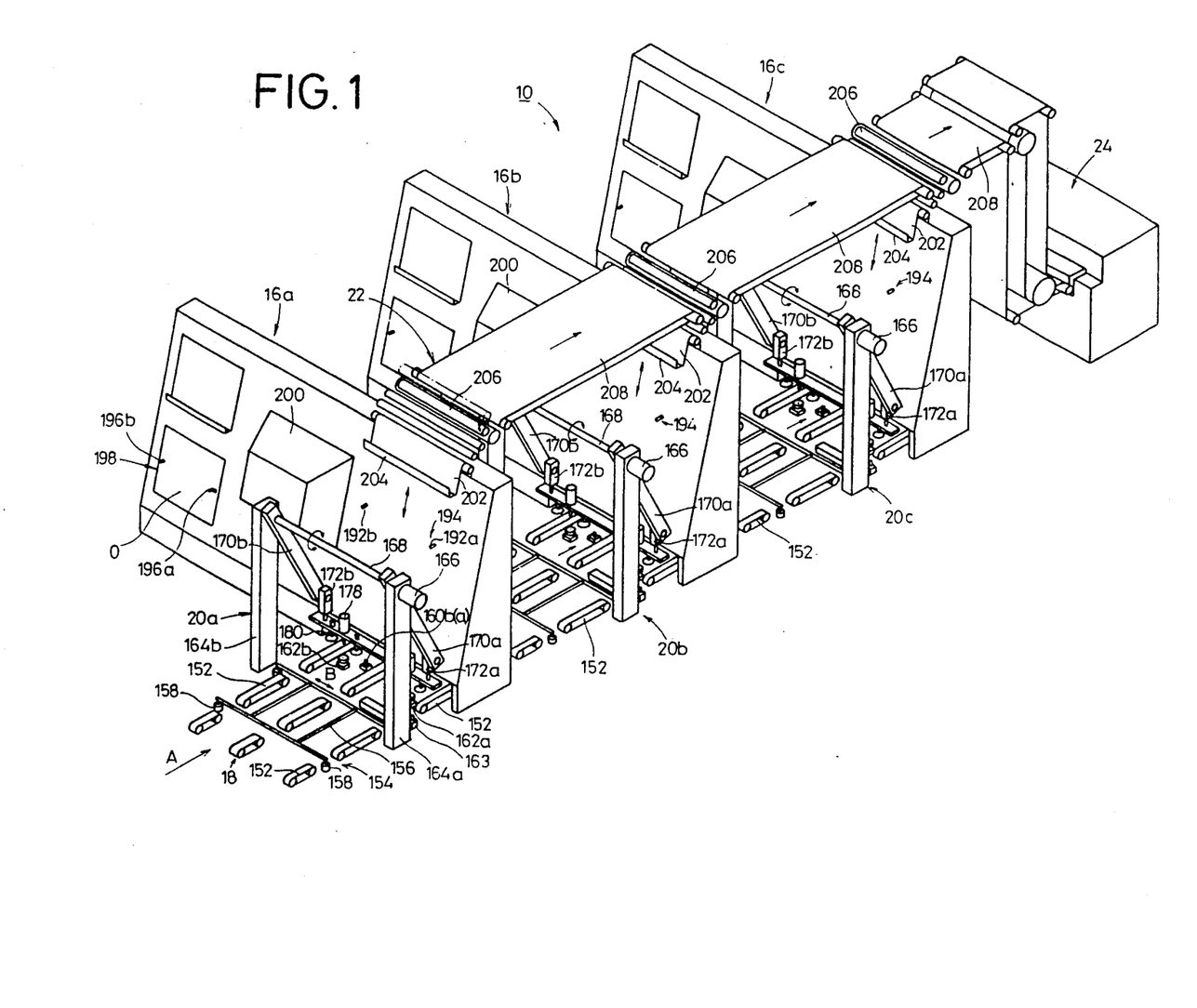
FIG. 1 is a perspective view of a portion of an automatic printing system according to the present invention.

The feeding device 18 comprises a plurality of bet conveyors 152 positioned upstream and downstream of the punching device 14 with respect to the feeding direction A. As shown in FIG. 1, the delivery device 20a includes a lifting and lowering mechanism 154 associated with the downstream belt conveyors 152. The lifting and lowering mechanism 154 has a frame 156 for supporting a print member S thereon, and cylinders 158 coupled to the frame 156 at respective corners thereof.

The delivery device 20a also includes stoppers 160a, 160b and receivers 162a, 162b, which are spaced from each other, are disposed near the lifting and lowering mechanism 154. A shifting mechanism 163 for positioning a printing member S in the direction B is also disposed near the lifting and lowering mechanism 154. Support posts 164a, 164b are positioned outside of the belt conveyors 152 and support, on their upper ends, a horizontal rotatable shaft 168 which is connected to a rotative drive source or actuator 166. Swing arms 170a, 170b are secured at one ends thereof to the rotatable shaft 168, and support respective cylinders 172a, 172b on their opposite ends. The cylinders 172a, 172b have respective piston rods 174a, 174b to which there is fixed a plate 176 that supports a positioning mechanism 178 and a suction mechanism 180 (see FIG. 7).

Figure 7:
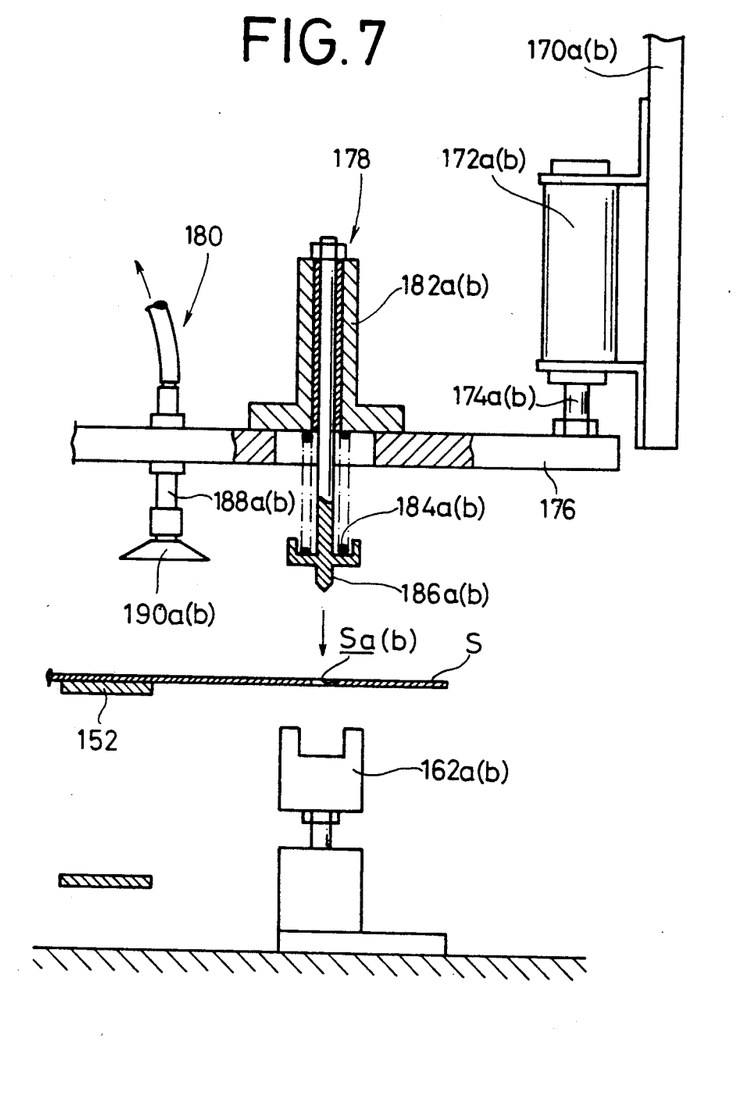
FIG. 7 is a side elevational view, partly in cross section, of a delivery device of the automatic printing system.

The positioning mechanism 178 has cylindrical support bodies 182a, 182b fixedly mounted on the pate 176 in vertical alignment with the receivers 162a, 162b, respectively. The cylindrical support bodies 182a, 182b receive therein respective positioning pins 186a, 186b which are slidably urged to move downwardly by respective springs 184a, 184b.

The suction mechanism 180 has pipes 188a, 188b connected to a vacuum source or generator (not shown) and fixedly mounted on the plate 176, and suction pads or cups 190a, 190b attached to the lower ends of the respective pipes 188a, 188b.

The delivery devices 20b, 20c are identical in structure to the deliver device 20a. Those parts of the delivery devices 20b, 20c which are identical to those of the delivery device 20a are denoted by identical reference numerals.

The printing devices 16a through 16c are of a known construction as disclosed in Japanese Laid-Open Patent Publication No. 57(1982)-201224, for example. Basically, each of the printing devices 16a through 16c comprises a printing member positioning mechanism 194 including positioning pins 192a, 192b, an original positioning mechanism 198 including pins 196a, 196b, and a printing unit 200 for exposing a printing member S to an image of an original O while the printing member S and the original O are being held in superposed condition after the printing member S and the original O have been delivered under suction by the positioning mechanisms 194, 198.

The discharging device 22 has withdrawal cloth webs 202 which are wound and stored in the respective printing devices 16a through 16c. The withdrawal cloth webs 202 are folded over above the printing devices 16a through 16c, and have engaging members 204 on their ends.

Feed rollers 206 are disposed near the cloth webs 202 folded over above the printing devices 16a through 16c. Belt conveyors 208 are trained around and extend between the feed rollers 206. The downstream belt conveyor 208 has a downstream end located closely to the automatic developing device 24.

The automatic printing system according to the present invention is basically constructed as described above. Now, operation of the automatic printing system will be described below.

First, print members S are loaded into the stocker 26 of the supplying device 12. A tray 30 which supports a predetermined number of printing members S of given size is positioned by the support arms 46a on the side surface 40a of the carriage 38. The carriage 38 is moved into a predetermined position in the stocker 26, after which the casters of the carriage 38 are locked by the lock lever 50b. At this time, the side surface 40b of the carriage 38 is positioned in facing relation to an empty tray 30 in the stocker 26. The empty tray 30 is pulled toward the carriage 38, and moved onto the side surface 40b while being guided by the guide rollers 42b, 44b on the carriage 38, after which the empty tray 30 is supported on the support arms 46b when the lever 48b is turned.

The lock lever 50b is turned to unlock the casters, and the carriage 38 is reversed to displace the side surface 40a into a predetermined position in the stocker 26. Then, the lever 48a is turned to transfer the tray 30 with the printing members S placed thereon onto the guide rollers 42a. Thereafter, the tray 30 is moved into a given position in the stocker 26 through the guide rollers 42a, 44a and 32, 34.

The rotative drive source 60 of the removal mechanism 28 is energized to cause the pinion 62 and the rack 56 to position the feed unit 58 into alignment with a tray 30 which carries desired printing members S. Then, the rotative drive source 70 is energized to cause the pinion 72 and the rack 66 to move the mobile base 68 toward the tray 30. The cylinder 74 is actuated to lower the rod 76 into the hole 36 of the tray 30, after which the rotative drive source 70 is reversed to enable the mobile base 68 to move the tray 30 into a predetermined position in the feed unit 58 while the tray 30 is being guided by the guide rollers 78, 80.

Then, after the feed unit 58 is moved in the direction A as desired, the rotative drive source 84 of the printing member pickup mechanism 82 is energized to swing the frame 86 toward the printing members S on the tray 30. At this time, the ball screw 90 has been turned by the rotative drive source 88 to bring the attachment bar 94 into a vertical position aligned with the height of the printing members S on the tray 30.

After the frame 86 reaches a predetermined angular position, the cylinders 96 are actuated to displace the suction pads 10 into pressed contact with the uppermost printing member S. Then, the rotative drive source 84 is reversed to pick up the uppermost printing member S, which has been attracted under suction by the suction pads 100, and to angularly displace the printing member S downwardly toward the belt conveyors 152. The cylinders 96 are actuated to displace the piston rods 98 downwardly, and the suction pads 100 are released from the printing member S. Thereafter, the belt conveyors 152 are actuated to feed the printing member S toward the punching device 14.

The rotative drive source 123 is actuated to cause the endless belts 116 to move the printing member S in the direction A until the leading end of the printing member S abuts against the engaging pins 138a, 138b of the positioning mechanisms 132a, 132b, whereupon the rotative drive source 123 is inactivated. The printing member S is now positioned in the direction A.

The rotative drive sources 126a, 126b are actuated to rotate the ball screws 128a, 128b to displace the movable bases 130a, 130b toward each other. When the engaging pins 142a, 142b of the positioning mechanisms 132a, 132b abut against the opposite sides of the printing member S, the printing member S is positioned in the direction B. The holder mechanism 150 is then actuated to hold the printing member S.

The cylinders 136a, 136b and 140a, 140b are actuated to lift the engaging pins 138a, 138b and 142a, 142b, after which the rotative drive sources 104, 126a, 126b are energized to move the punching mechanisms 134a, 134b into a predetermined position with respect to the printing member S. The cylinders 144a, 144b of the punching mechanisms 134a, 134b are selectively actuated to cause the punches 146a, 146b and the dies 148a, 148b to form circular or oblong holes or openings Sa, Sb in the printing member S.

After the printing member S is punched, the movable bases 130a, 130b are moved back to their retracted positions, and the holder mechanism 150 is inactivated. The rotative drive source 123 is then actuated to feed the printing member S in the direction A. At this time, the upper guide rollers 112a, 112b are elevated by the cylinders 114, 120 to prevent the printing member S from contacting the holder mechanism 150.

The printing member S with the openings Sa, Sb defined therein is fed toward the delivery device 20a by the belt conveyors 152 of the feeding device 18. When the printing member S engages the stoppers 160a, 160b, the feeding device 18 is inactivated. Thereafter, the printing member S is laterally positioned in the direction B by the shifting mechanism 163, and then the cylinders 172a, 172b of the delivery device 20a are actuated to lower the plate 176. The positioning pins 186a, 186b of the positioning mechanism 178 are inserted through the openings Sa, Sb in the printing member S into the engagement with the receivers 162a, 162b, respectively. The suction pads 190a, 190b of the suction mechanism 180 then attract and hold the printing member S under suction when the vacuum source coupled to the suction pads 190a, 190b is actuated.

The cylinders 172a, 172b are actuated to elevate the plate 176 to lift the leading end of the printing member S which is being held by the suction pads 190a, 190b. At the same time, the cylinder 158 of the lifting and lowering mechanism 154 is actuated to lift the frame 156, so that the printing member S is positioned upwardly of the belt conveyors 152. Another printing member S is fed from the supplying device 12 and punched by the punching device 18, and thereafter moved below the printing device 16a by the belt conveyors 152 of the feeding device 18 and held under suction by the delivery device 20b which is positioned in front of the printing device 16b. Likewise, still another printing member S is fed, punched, moved below the printing devices 16a, 16b, and held under suction by the delivery device 20c in front of the printing device 16c.

In the delivery device 20a, the rotative drive source 166 is actuated to rotate the rotatable shaft 168 about its own axis, for thereby swinging the swing arms 170a, 170b toward the printing device 16a. Thereafter, the cylinders 172a, 172b are actuated to displace the plate 176 toward the positioning mechanism 194. The positioning pins 186a, 186b are engaged by the pins 192a, 192b, respectively, which are then fitted into the respective openings Sa, Sb in the printing member S which is being held by the suction pads 190a, 190b. The printing member S is then released from the suction pads 190a, 190b, and the cylinders 172a, 172b are actuated to retract the plate 176, whereupon the printing member S is supported by the positioning mechanism 194.

The printing member S is held under suction by a feed mechanism (not shown) and moved thereby into the printing unit 200, which is also supplied with an original O from the positioning mechanism 198. In the printing unit 200, the original O and the printing member S are superposed one on the other, and a light source (not shown) is energized to expose the printing member S to the image on the original O.

While the printing member S is being exposed in the printing unit 200, another printing member S which has already been exposed is moved toward the positioning mechanism 194, and placed on the engaging member 204 of the withdrawal cloth web 202. The withdrawal cloth web 202 is wound by an actuator (not shown) to lift the engaging member 204 until the printing member S is gripped by a roller pair 206. The roller pair 206 is rotated to move the printing member S onto the belt conveyor 208. The belt conveyor 208 is actuated to deliver the printing member S into the automatic developing device 24. After the latent image on the printing member S is developed into a visible image by the automatic developing device 24, the printing member S is stored into a stocker (not shown).

As described above, the printing member S is fed from the supplying device 12 and punched by the punching device 14, and thereafter fed to the delivery device 20a by the feeding device 18, after which the printing member S is automatically delivered to the positioning mechanism 194 of the printing device 16a by the delivery device 20a. Therefore, the conventional process of manually mounting the printing member in the positioning mechanism is automatized according to the present invention. The printing member S which has been exposed in the printing device is automatically delivered to the automatic developing device 24 by the discharging device 22.

As a consequence, the printing process which includes various steps, such as of supplying printing members S to the printing devices 16a through 16c, exposing the printing members S, and developing the printing members S, can efficiently and automatically be carried out. While one printing member S is being exposed in the printing device 16a, other printing members S can also be exposed substantially simultaneously in the other printing devices 16b, 16c. Therefore, a large number of printing members S can efficiently be exposed to desired images.

While the discharging device 22 is disposed upwardly of the printing devices 16a through 16c, the discharging device 22 may be dispensed with, and printing members S may be discharged by the coaction of the feeding device 18 and the delivery devices 20a through 20c. In such a modification, a printing member S, which is supported by the positioning mechanism 194 after the printing member S has been exposed, is delivered onto the belt conveyors 152 by the delivery device 20a which operates in a sequence that is a reversal of the aforesaid sequence, and then is fed to the automatic developing device 24 by the belt conveyors 152.

The automatic printing system according to the present invention is advantageous in that since a printing member which is fed by the feeding device is automatically brought into engagement with the positioning mechanism of the printing device by the delivery device, the entire printing process is automated and efficiently carried out without manual intervention.

Although a certain preferred embodiment has been shown and described, it should be understood that many changes and modifications may be made therein without departing from the scope of the appended claims.

What is claimed is:

1. An automatic printing system comprising:
   an array of printing devices for exposing a printing member, said printing devices being arranged along a direction in which the printing member is fed, each of said printing devices having a positioning mechanism for positioning the printing member;
   a feeding device for feeding the printing member to said printing devices, said feeding device comprising a belt conveyor for feeding the printing member and a plurality of lifting and lowering mechanism associated respectively with said printing devices for lifting the printing member to be delivered to one of said printing devices while allowing another printing member to pass through the other printing devices;

a delivery device for picking up the printing member from said feeding device and bringing the printing member into engagement with said positioning mechanism; and a discharging device for discharging the printing member, which has been exposed by a printing device of said printing devices, from said printing device.

2. An automatic printing system according to claim 1, further including a supplying device for storing printing members of different sizes and selectively supplying the printing members one at a time, said supplying device being disposed upstream of said printing devices along a direction in which the printing member is fed; and a punching device for forming a positioning hole in the printing member supplied by said supplying device.

3. An automatic printing system according to claim 1, further including an automatic developing device for developing the printing member which has been exposed by said printing device, said automatic developing device being disposed downstream of said printing devices along a direction in which the printing member is fed.

4. An automatic printing system comprising:

at least one printing device for exposing a printing member, said printing device having a positioning mechanism for positioning the printing member;

a feeding device for feeding the printing member to said printing device;

a delivery device for picking up the printing member from said feeding device and bringing the printing member into engagement with said positioning mechanism, said delivery device comprising a swing arm, a plate movably mounted on said swing arm, a positioning mechanism mounted on said plate for engaging in holes defined in the printing member, and a suction mechanism mounted on said plate for holding the printing member under suction; and a discharging device for discharging the printing member, which has been exposed by said printing device, from said printing device.

5. An automatic printing system according to claim 4, further including an automatic developing device for developing the printing member which has been exposed by said printing device, said automatic developing device being disposed downstream of said printing device along a direction in which the printing member is fed.

6. An automatic printing system according to claim 4, further including a supplying device for storing printing members of different sizes and selectively supplying the printing members one at a time, said supplying device being disposed upstream of said printing device along a direction in which the printing member is fed, and a punching device for forming a positioning hole in the printing member supplied by said supplying device.

* * * * *